(12) United States Patent
Datta

(10) Patent No.: US 6,750,133 B2
(45) Date of Patent: Jun. 15, 2004

(54) SELECTIVE BALL-LIMITING METALLURGY ETCHING PROCESSES FOR FABRICATION OF ELECTROPLATED TIN BUMPS

(75) Inventor: Madhav Datta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/279,478

(22) Filed: Oct. 24, 2002

(65) Prior Publication Data

US 2004/0080024 A1 Apr. 29, 2004

(51) Int. Cl.[7] .............................................. H01L 21/44
(52) U.S. Cl. ........................................ 438/613; 438/614
(58) Field of Search ................................ 438/613, 614, 438/612, 611; 257/737, 738

(56) References Cited

U.S. PATENT DOCUMENTS

| | | | |
|---|---|---|---|
| 6,569,752 B1 | * | 5/2003 | Homma et al. ............. 438/597 |
| 2003/0129822 A1 | * | 7/2003 | Lee et al. .................. 438/613 |
| 2004/0005771 A1 | * | 1/2004 | Fan et al. .................. 438/613 |

* cited by examiner

*Primary Examiner*—Phat X. Cao
(74) *Attorney, Agent, or Firm*—Schwegman, Lundberg, Woessner & Kluth, P.A.

(57) ABSTRACT

A ball-limiting metallurgy stack is disclosed for an electrical device that contains at least one copper layer disposed upon a titanium adhesion metal layer. The ball-limiting metallurgy stack resists tin migration toward the upper metallization of the device. An etch process flow is also disclosed which resists the redepostion of the tin during etching of a copper layer.

23 Claims, 5 Drawing Sheets

SELECTIVE BALL-LIMITING METALLURGY ETCHING PROCESSES FOR FABRICATION OF ELECTROPLATED TIN BUMPS

TECHNICAL FIELD

An embodiment of the present invention relates generally to integrated circuit fabrication. More particularly, an embodiment of the present invention relates to electrical connection technology. In particular, an embodiment of the present invention relates to a ball-limiting metallurgy comprising a copper layer.

DESCRIPTION OF RELATED ART

Electrical bump connectors such as metal bumps or balls are used in flip-chip applications that may include controlled collapse (C4) flip-chip applications. As the progress of miniaturization continues, selective formation of electrical connections becomes increasingly challenging. One structural quality that is often used is dissimilar conductive layers which serve barrier, adhesion, and seeding purposes among others. Consequently, etch-processing formation of specific connections can result in destructive removal of required electrical connections. Similarly, etch processing can also result in stopped etches due to unwanted oxide films which form a husk over the material to be etched.

As the progress of miniaturization also continues, the junction between a microelectronic device metallization and the electrical bump becomes increasingly large relative to the mass of the electrical bump. Consequently, junction disparities have an increasingly detrimental effect on electrical communication between the device and the electrical bump. One junction disparity relates to migration of the flip-chip tin, typically from Sn37Pb solder, toward the metallization. Another consequence of miniaturization is stress that builds up in the ball-limiting metallurgy due to the formation of tin-containing intermetallic structures between the metallization and the electrical bump.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

An embodiment of the present invention relates to a ball-limiting metallurgy (BLM) stack that facilitates miniaturization, that obviates the effects of destructive etching and/or the destructive effects of etch-interrupting formation of films.

In one embodiment, a metal first layer is disposed above and on the metallization. A metal second layer is disposed above and on the metal first layer. A copper stud is disposed over the metal second layer. An electrically conductive bump is disposed above and on the copper stud.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of embodiments most clearly, the drawings included herein are diagrammatic representations of integrated circuit structures. Thus, the actual appearance of the fabricated structures, for example in a photomicrograph, may appear different while still incorporating the essential structures of embodiments of the present invention. Moreover, the drawings show only the structures necessary to understand embodiments of the present invention. Additional structures known in the art have not been included to maintain the clarity of the drawings.

Figure 1:
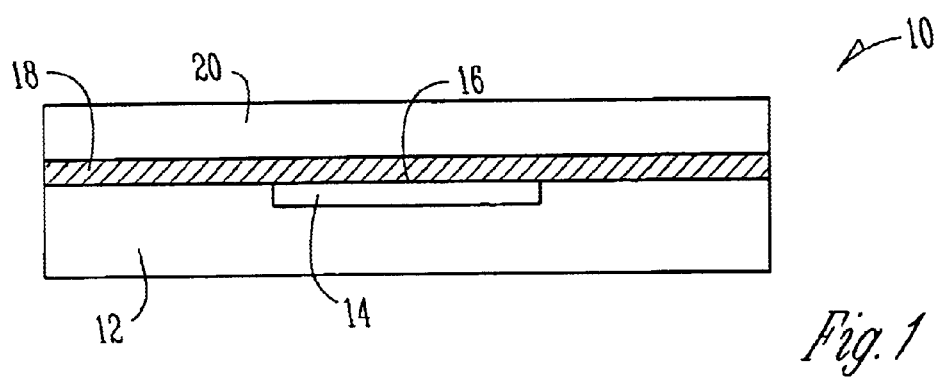
FIG. 1 is an elevational cross-section of a semiconductor structure which reveals metallization.

FIG. 1 is an elevational cross-section of a semiconductor structure that reveals metallization. FIG. 1 is a cross-section of a semiconductor structure 10 during fabrication that includes a substrate 12 and a metallization 14 such as a copper pad that makes connection to what is commonly referred to as metal six (M6) or metal seven (M7) by way of non-limiting example. In one embodiment, metallization 14 is coplanar with an upper surface 16 of the substrate 12. In one embodiment, the substrate 12 is an interlayer dielectric (ILD) composition. A nitride layer 18 is formed over the substrate 12 and the metallization 14. Additionally, a passivation layer 20 is formed over the nitride layer 18. The passivation layer 20 and the nitride layer 18 act to protect substrate 12 and to expose metallization 14 according to the patterning. In one embodiment, the passivation layer 20 is a polyimide material. In one embodiment, the passivation layer is an inorganic material such as a silicon oxide that is formed by the decomposition of tetraethyl ortho silicate (TEOS).

Figure 2:
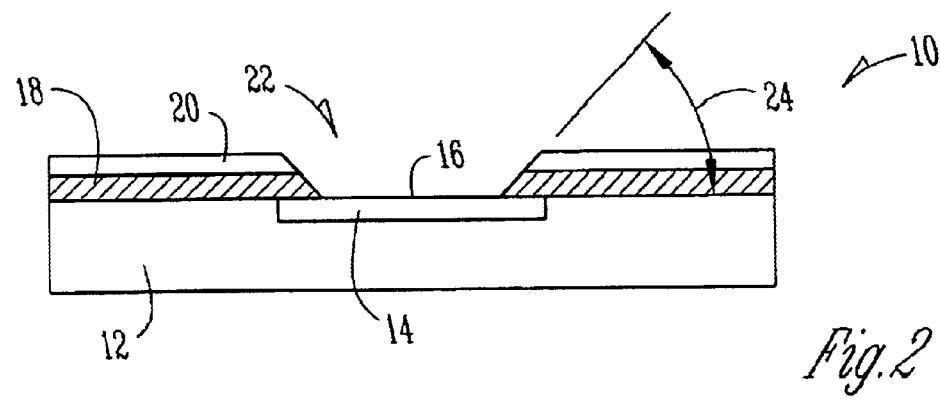
FIG. 2 is an elevational cross-section of the semiconductor structure depicted in FIG. 1 after patterning of a passivation layer.

FIG. 2 is an elevational cross-section of the semiconductor structure depicted in FIG. 1 after patterning of a passivation layer. FIG. 2 illustrates a patterned passivation structure, that includes portions of former nitride layer 18 and passivation layer 20, and that exposes a portion of the metallization 14. Patterning is accomplished by use of a first mask (not pictured) to form a recess 22 during an etch process. In one embodiment, the process is carried out by blanket forming the nitride layer 18 and the passivation layer 20, patterning, etching the recess 22, and curing the passivation layer 20 where the passivation layer 20 is a polyimide.

After the cure, the passivation layer 20 has formed a slope 24 that in one embodiment, has an angle, in a range from about 30° to about 60°. In one embodiment, the angle is about 45°.

Figure 3:
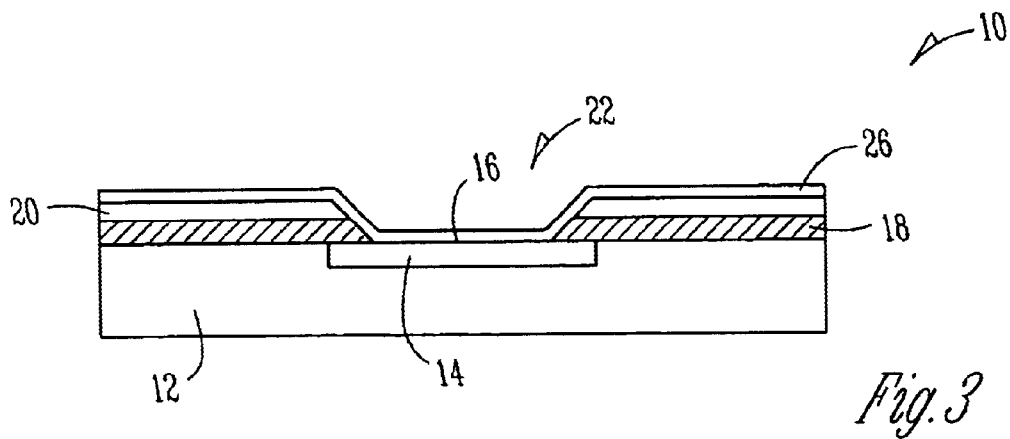
FIG. 3 is an elevational cross-section of the semiconductor structure depicted in FIG. 2 after further processing.

FIG. 3 is an elevational cross-section of the semiconductor structure depicted in FIG. 2 after further processing. FIG. 3 illustrates further processing that is carried out where the patterned passivation layer 20, the patterned nitride layer 18, and the metallization 14 are covered with a metal first layer 26.

In one embodiment, the metal first layer 26 is one of a refractory metal, a refractory metal alloy, or a doped refractory metal. In one embodiment, the refractory metal alloy or the doped metal is in either a stoichiometric or a solid solution ratio.

In one embodiment, the metal first layer 26 is a refractory metal such as titanium, zirconium, hafnium, a combination thereof, and the like. Other embodiments of refractory metals for the metal first layer 26 include at least one selected from nickel, cobalt, palladium, platinum, a combination thereof, and the like. Other embodiments of refractory metals for the metal first layer 26 include at least one of chromium, molybdenum, tungsten, a combination thereof, and the like. Other embodiments of refractory metals for the metal first layer 26 include at least one of scandium, yttrium, lanthanum, cerium, a combination thereof, and the like.

In one embodiment, a property of the metal first layer 26 is that the metal first layer 26 exhibits sufficient adhesion to the metallization 14 that liftoff or spalling thereof will not occur during fabrication, test, and ordinary field use.

In one embodiment, the metal first layer 26 is a vanadium-alloyed or vanadium-doped metal. The vanadium can be added where the refractory metal is ferroelectric. In one embodiment, the metal first layer 26 is a metal, a vanadium-alloyed, or vanadium-doped metal of at least one selected from titanium, zirconium, hafnium, and the like. In another embodiment, the metal first layer 26 is a metal, a vanadium-alloyed, or vanadium-doped metal of at least one selected from chromium, molybdenum, tungsten, and the like. In another embodiment, the metal first layer 26 is a metal, a vanadium-alloyed, or vanadium-doped metal of at least one selected from scandium, yttrium, lanthanum, cerium, and the like.

Referring again to FIG. 3, the metal first layer 26 in one embodiment is titanium (Ti) that is formed by physical vapor deposition (PVD) to a thickness in a range from about 500 Angstrom (Å) to about 2,000 Å. In one embodiment, the metal first layer 26 is in a thickness range of about 1,000 Å. In another embodiment, the metal first layer 26 is chromium (Cr) that is formed by PVD to a thickness in a range from about 500 Å to about 2,000 Å. In one embodiment, the metal first layer 26 is in a thickness range of about 1,000 Å. In another embodiment, the metal first layer 26 is tungsten (W) that is formed by PVD to a thickness in a range from about 500 Å to about 2,000 Å. In one embodiment, the metal first layer 26 is in a thickness range of about 1,000 Å. In another embodiment, metal first layer 26 is titanium-tungsten (TiW) that is formed by PVD to a thickness in a range from about 500 Å to about 2,000 Å. In one embodiment, the metal first layer 26 is in a thickness range of about 1,000 Å. In each embodiment, the metal first layer 26 is sputtered under conditions that put it under a compressive stress. Such sputtering conditions are known in the art.

Figure 4:
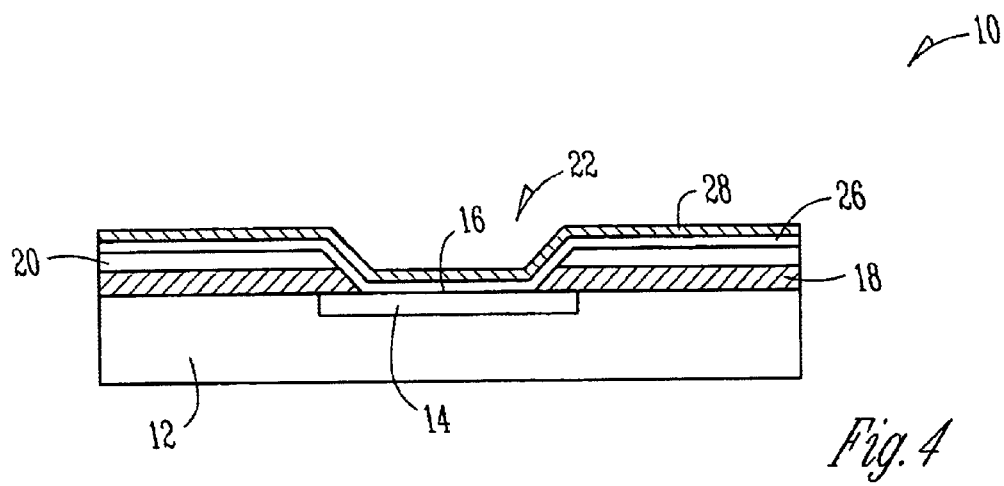
FIG. 4 is an elevational cross-section of the semiconductor structure depicted in FIG. 3 after further processing.

FIG. 4 is an elevational cross-section of the semiconductor structure depicted in FIG. 3 after further processing. FIG. 4 illustrates further processing in which the metal first layer 26 is covered with a metal second layer 28. The metal second layer 28 is a seed layer for subsequent plating processes and is formed by PVD according to known technique. In one embodiment, the metal second layer 28 is sputtered copper and is sputtered under conditions to impart a compressive stress therein. Such conditions are known in the art. In one embodiment, a silver metal second layer 28 is formed above the metal first layer 26. In one embodiment, a gold metal second layer 28 is formed above the metal first layer 26. In one embodiment, the metal second layer is a combination of at least one of copper, silver, and gold. In one embodiment, an aluminum or aluminum alloy metal second layer 28 is formed above the metal first layer 26.

In one embodiment, the metal second layer 28 has a thickness in a range from about 1,000 Å to about 5,000 Å. In one embodiment, the metal second layer 28 has a thickness in a range from about 1,500 Å to about 4,000 Å. In one embodiment, the metal second layer 28 has a thickness of about 2,000 Å.

Figure 5:
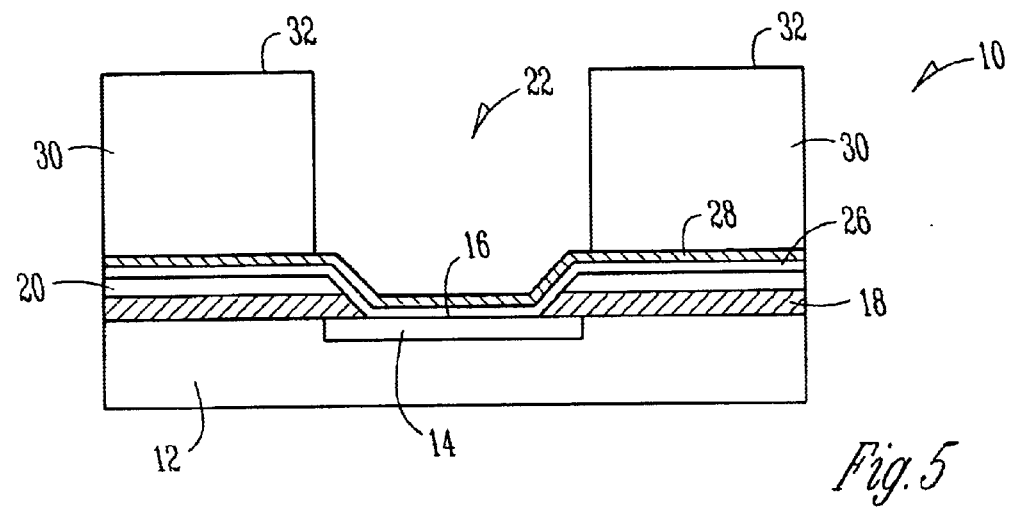
FIG. 5 is an elevational cross-section of the semiconductor structure depicted in FIG. 4 after further processing.

FIG. 5 is an elevational cross-section of the semiconductor structure 10 depicted in FIG. 4 after further processing. FIG. 5 illustrates further processing in which a second mask 30 is patterned to expose the metal second layer 28 where the exposure is substantially centered over the metallization 14. The second mask 30 is peripherally patterned because a plating process is carried out to plate a copper stud that adheres to the metal second layer 28. The second mask 30 is referred to as a "thick mask" because subsequent plating processes are carried out in the well formed by the second mask 30 that includes the recess 22 at the bottom thereof, below the upper surface 32 of the second mask 30.

Figure 6:
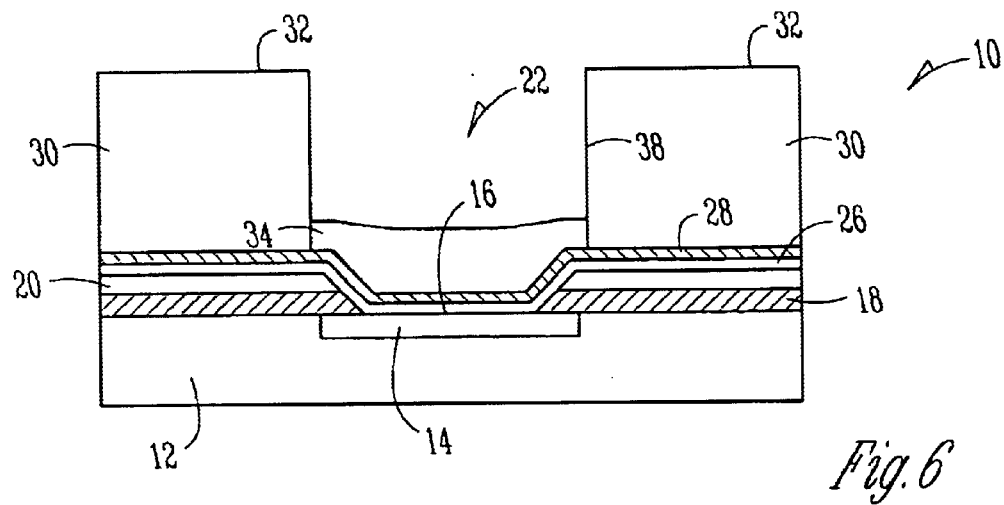
FIG. 6 is an elevational cross-section of the semiconductor structure depicted in FIG. 5 after further processing.

FIG. 6 is an elevational cross-section of the semiconductor structure 10 depicted in FIG. 5 after further processing. According to the general embodiments, following the formation of the metal first- and second layers 26 and 28, respectively, processing may continue by plating a metal stud over the two-metal-layer stack. The semiconductor structure 10 is formed where the metal third layer includes a stud 34. In one embodiment, the stud is at least one of copper, silver, or gold. In one embodiment, the stud 34 is aluminum or an aluminum alloy.

In one embodiment, plating is carried out by electroplating technique known in the art. In one embodiment, plating is carried out by an electroless plating technique known in the art. Hereinafter, the stud 34 is referred to by way of non-limiting example as a "copper stud 34".

In one embodiment, the copper stud 34 has a thickness in a range from about 5 microns to about 15 microns. In one embodiment, the copper stud 34 has a thickness of about 10 microns. The thickness of the copper stud 34 is measured from the upper surface 16 of the substrate, until the most prominent portion thereof. Under certain applications, a 10-micron thick copper stud 34 provides sufficient excess copper to absorb migrating tin form either the solder ball of the semiconductor structure 10 that will be formed, or from solder ball of a flip chip. One embodiment includes a metal stack of the metal first layer 26 of Ti at about 1,000 Å, the copper metal second layer 28 at about 2,000 Å, and the copper stud 34 of Cu at about 10 microns. In one embodiment when the metal third layer 34 is not copper, another metal is selected to be an electrical match for the metal second layer 28.

Figure 7:
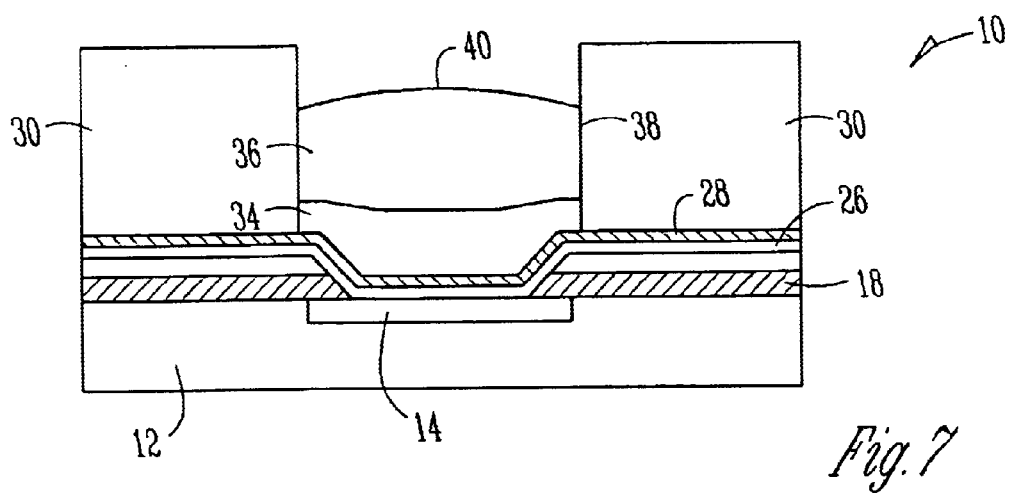
FIG. 7 is an elevational cross-section of the semiconductor structure depicted in FIG. 6 after further processing.

FIG. 7 is an elevational cross-section of the semiconductor structure 10 depicted in FIG. 6 after further processing. Following the formation of the metal layers 26, 28, and 34 as set forth herein, processing continues by plating a bump precursor 36 over the three-metal-layer stack according to various process flow embodiments.

FIG. 7 illustrates further processing in which a bump precursor 36 has been plated over the copper stud 34 through the second mask 30. In one embodiment, plating is carried out by electroless plating techniques as is known in the art. In one embodiment, plating is carried out by electroplating techniques as is known in the art. By way of non-limiting example, electroplating is carried out to form the bump precursor 36 as a discrete structure that is spaced-apart from any closest neighboring bump precursors. Accordingly, the bump precursor 36 has a rectilinear perimeter (not pictured) and a substantially rectilinear vertical profile. By "substantially rectilinear vertical profile" it is meant the sidewalls 38 have a profile that reflects the contour of the second mask 30 that in one embodiment, is substantially vertical as reflected by the patterning technique that was used to form the second mask 30. The upper surface 40 of the bump precursor 36, however, has a profile that is incidental to the conditions of plating according to the various embodiments.

In one embodiment, the bump precursor 34 is a substantially lead-free solder according to the various lead-free solders known in the art.

In selected embodiments, the bump precursor 34 is a tin-lead solder composition such as Sn97Pb. A tin-lead solder composition that may be used with a substrate that is to be flip-chip mounted over the semiconductor structure 10 is a Sn37Pb composition. In any event, the bump precursor 34 may be a tin-lead solder comprising $Sn_xPb_y$, wherein x+y total 1, and wherein x is in a range from about 0.3 to about 0.99. In one embodiment, the bump precursor button 34 is a tin-lead solder composition of Sn97Pb, and substrate solder for forming the flip-chip bond is a tin-lead solder composition of Sn37Pb.

In one embodiment, the copper stud 34 acts as a significant tin absorber, particularly for lead-free solders, or for lead-containing solders such as Sn37Pb from a flip-chip solder that will mingle with the solder ball of the semiconductor structure 10.

Figure 8:
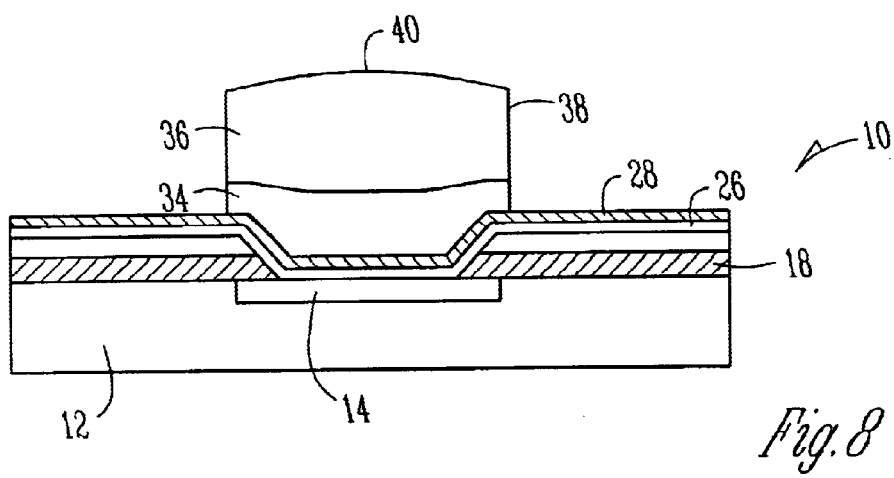
FIG. 8 is an elevational cross-section of the semiconductor structure depicted in FIG. 7 after further processing.

FIG. 8 is an elevational cross-section of the semiconductor structure 10 depicted in FIG. 7 after further processing. FIG. 8 illustrates further processing in which the second mask 30 (FIG. 7) is removed. In one embodiment, the second mask 30 is removed by wet stripping according to a stripping chemistry that will leave the metal layers 26, 28, 34, and 36.

Figure 9:
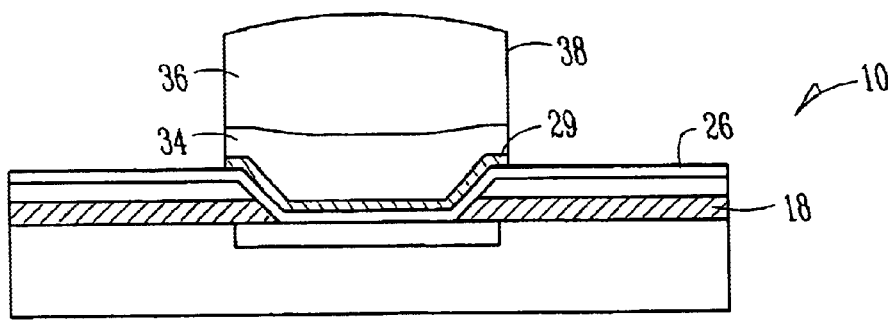
FIG. 9 is an elevational cross-section of the semiconductor structure depicted in FIG. 8 after further processing.

FIG. 9 is an elevational cross-section of the semiconductor structure 10 depicted in FIG. 8 after further processing. In FIG. 9, an etch process has been carried out which has removed the copper seed second layer 28 in locations that are peripheral to the sidewalls 38 of the bump precursor 36 and the copper stud 34. Accordingly the copper seed second layer 28 has become a metal second layer 29 of an intermediate structure. According to an embodiment, no significant amount of a non-soluble oxide film, such as a tin oxide film is formed over the copper seed second layer 28 (FIG. 8) during etch formation of the copper seed second layer 29. Similarly, the etch recipe is selective to the lead-free tin in the bump precursor 36.

In one embodiment, the etch recipe includes a first etching from about 0.5 to about 2 parts etchant, from about 5 to about 20 parts pH adjustor, and the balance water. In one embodiment, the etch recipe includes a first etching from about 0.5 to about 2 parts $H_2O_2$, about 10 parts pH adjustor, and about 50 parts water. In one embodiment the etch recipe includes a first etching of about 1 part $H_2O_2$, about 10 parts ammonium hydroxide pH adjustor, and about 50 parts water.

In another embodiment, the pH adjustor is an inorganic base such as sodium hydroxide and the like. In another embodiment, the pH adjustor is an organic base such as tetramethyl ammonium hydroxide (TMAH) and the like. In another embodiment, the pH adjustor is a composition that, in combination with an effective amount of the etchant in solution, will resist the redeposition of the conductive bump 36 onto the metal second layer 28. Otherwise, etching of the metal second layer 28 is compromised.

In one embodiment, the etchant is ammonium persulphate that is provided in the same molar equivalent concentration ratios as set forth above in lieu of the $H_2O_2$ etchant above. In another embodiment, the etchant is a combination of ammonium persulphate and $H_2O_2$ that is provided in the same molar equivalent concentration ratios as set forth above. In one embodiment, the $H_2O_2$ is provided as more than half of the combination of the $H_2O_2$ and ammonium persulphate.

In one embodiment, the etch recipe includes a first etching with a solution including from about 0.5 to about 2 parts $H_2O_2$, about 10 parts ammonium hydroxide, and about 50 parts water, and the first etching includes substantially removing the copper-containing seed second layer 28 at ambient temperature, and for a time period to penetrate and remove the copper-containing seed second layer 28, where the copper-containing seed second layer 28 is from about 500 Å to about 4,000 Å. In one embodiment, etch processing is carried out in a basic (about pH 7 and higher) solution. In one embodiment, a 2,000 Å thick copper-containing seed second layer 28 is etched under the above conditions during a time period from about 2 to about 5 minutes.

Figure 10:
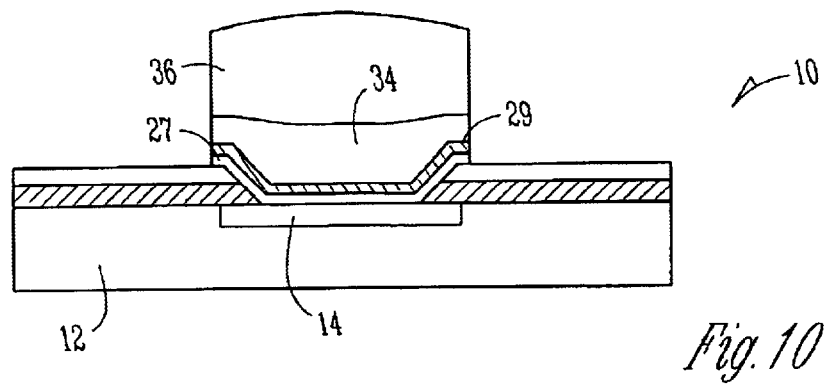
FIG. 10 is an elevational cross-section of the semiconductor structure depicted in FIG. 9 after further processing.

FIG. 10 is an elevational cross-section of the semiconductor structure 10 depicted in FIG. 9 after further processing. The structure 10 is an intermediate structure according to an embodiment. In FIG. 9, an etch process has been carried out which has removed the titanium barrier metal first layer 26 in locations that are peripheral to the sidewalls 38 of the bump precursor 36 and the copper stud 34. Accordingly the titanium barrier metal first layer 26 has become a metal first layer 27. FIG. 10 illustrates the titanium-containing barrier first layer 27 terminates in a plane that is substantially parallel to the sidewall 38 of the tin-containing bump 36. FIG. 10 also illustrates the copper-containing seed second layer 29 terminates in a plane that is substantially parallel to the side of the tin-containing bump terminates in a plane that is substantially parallel to the sidewall 38 of the tin-containing bump 36.

According to an embodiment, no significant amount of a non-soluble oxide film, such as a tin oxide film is formed over the titanium barrier metal first layer 26 (FIG. 9) during etch formation of the titanium barrier metal first layer 27. Similarly, the etch recipe is selective to the lead-free tin in the bump precursor 36.

In one embodiment, the etch recipe includes a second etching from about 0.5 to about 2 parts etchant, and from about 100–500 parts water. In one embodiment, the etch recipe includes a second etching from about 0.5 to about 2 parts HF and about 180 parts water. In another embodiment, the etchant is a non-fluorine etchant that includes a molar equivalent to the HF second etch embodiments.

In one embodiment, the etch recipe includes a second etching with a solution including from about 0.5 to about 2 parts HF, about 180 parts water, and the second etching includes substantially removing the titanium-containing barrier metal first layer 26 at ambient temperature, and for a time period to penetrate and remove the titanium-containing barrier metal first layer 26, where the titanium-containing barrier metal first layer 26 is from about 500 Å to about 2,000 Å. In one embodiment, a 1,000 Å thick titanium-containing barrier metal first layer 26 is etched under the above conditions during a time period from about 2 to about 5 minutes.

Figure 11:
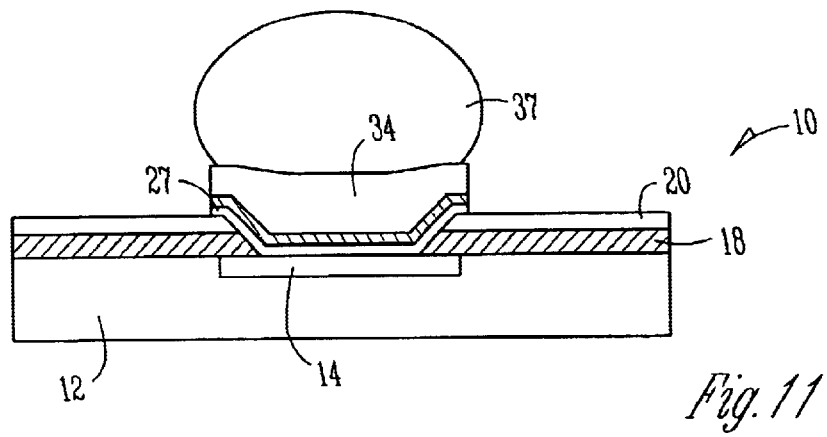
FIG. 11 is an elevational cross-section of the semiconductor structure depicted in FIG. 10 after further processing.

FIG. 11 is an elevational cross-section of the semiconductor structure to depicted in FIG. 10 after further processing. The structure 10 represents an intermediate structure according to an embodiment. The bump precursor 36 has been reflowed to form a solder ball 37. In the embodiment depicted in FIG. 11, the solder ball 37 has reflowed above the copper stud 34 without wetting the sidewalls 38 thereof. In another embodiment, the solder ball 37 can wet at least a portion of the sidewalls 38 of the copper stud 34 (e.g. FIG. 12). In another embodiment the bump precursor 36 is not reflowed until it has been contacted with another structure such as a mounting substrate.

In selected embodiments, the vertically measured diameter of the solder ball 37 is in a range from about 50 microns to about 200 microns. In another embodiment, the major vertical dimension of bump precursor 36 is about 100 microns before it is reflowed, and it is about 60 microns after it is reflowed into the solder ball 37.

The eccentricity (height, divided by width) of the solder ball 37 may be in a range from about 0.5 to about 1.2. A lower eccentricity may be preferred where the pitch of a given ball array would lead to a bridging problem between neighboring balls during reflow or during reflow flip-chip mounting. Eccentricity may be controlled by solder ball amount and solder ball wetting properties in relation to the copper stud 34.

Because some intermetallic material may form between the solder ball 37 and the copper stud 34, the metal layers 27, 29, and 34 act to prevent excessive intermetallic formation or to resist tin migration toward the metallization 14. With the presence of the copper stud 34, eventually, the intermetallic zone can grow to a size and shape that acts as a barrier to further tin migration. In other words, the intermetallic zone (not pictured) substantially isolates the metallization 14 from the solder ball 37.

Figure 12:
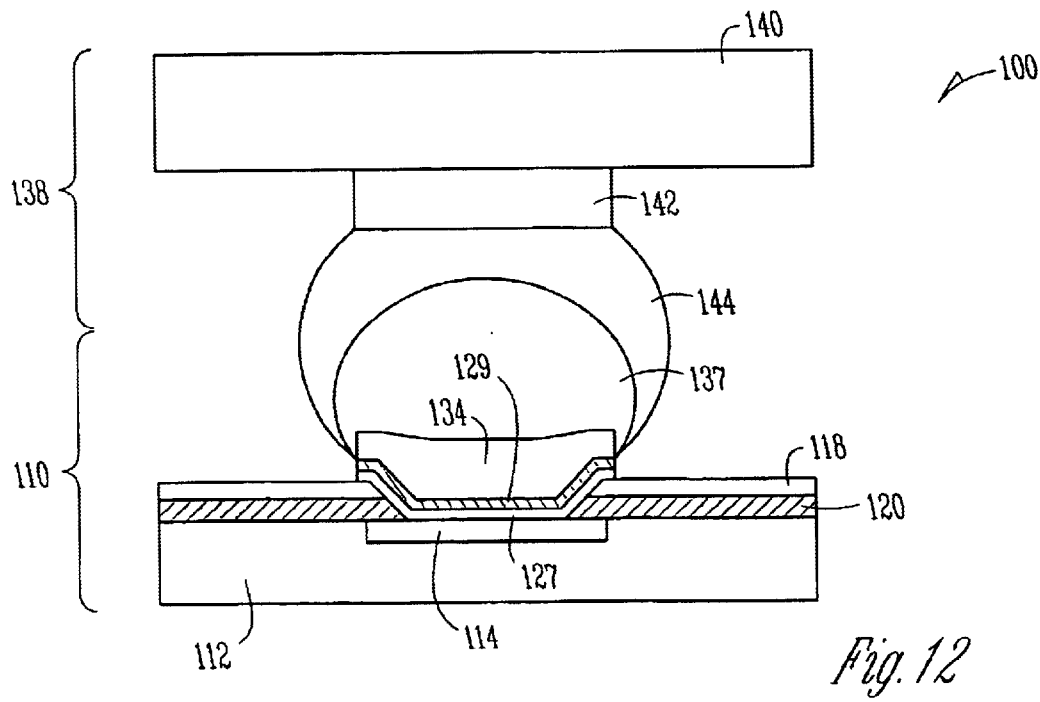
FIG. 12 is an elevational cross-section of a semiconductor device structure embodiment.

FIG. 12 is an elevational cross-section of a semiconductor device 100 structure embodiment. A mounting substrate 138 is combined with a semiconductor structure 110. The combination of the semiconductor structure 110 and the mounting substrate 138 form a flip chip configuration 100 that constitutes a system according to an embodiment The system may comprise any electrical device that employs flip-chip technology. Similarly, the semiconductor structure 10 depicted in FIGS. 10 and/or 11 can be part of a system.

The semiconductor structure 110 includes a substrate 112, metallization 114, and passivation layers 120 and 118. Further the semiconductor structure 110 includes a barrier metal first layer 127 and a seed metal second layer 129. The semiconductor structure 110 also includes a copper stud 134 and a solder ball 137 that has reflowed, in this embodiment, to have wetted down to and including the copper metal second layer 129.

The mounting substrate 138 includes incidental structures such as a circuit board 140 or the like, an electrical bond pad 142 or the like, and a solder ball 144 or the like.

The following is an example of a process flow embodiment for the formation of a semiconductor structure such as the semiconductor structure 10 depicted in FIGS. 10 or 11.

Reference may be made to FIGS. 1–11. A substrate 12 containing an M7 or M6 (or lower) metallization and a metallization 14 bond pad is provided. The substrate 12 contains a silicon oxide ILD material as is known in the art. A passivation layer 20 and a nitride layer 18 are formed over the substrate 12 and the metallization 14. Thereafter, the passivation layer, in this example a polyimide, is hard baked and cured. Next, patterning is carried out. The patterned passivation layer 20 and the patterned nitride layer 18 layer are formed according to known technique and as set forth herein.

A metal first layer 26 is formed by PVD of Ti over the substrate 12 and structures supported thereon. The metal first layer 26 is about 1,000 Å thick and is under a compressive stress. Next, a copper metal second layer 28 is formed by PVD over the metal first layer 26. The copper metal second layer 28 is sputtered under conditions to impart a compressive stress therein. The copper metal second layer 28 is about 2,000 Å thick. A thick, second mask 30 is formed from photoresist material that is spun on, cured, exposed, and patterned. Thereafter, a copper stud 34 is electroplated to a thickness of about 10 microns.

After the formation of the three metal layers 26, 28 and 34, an electroplating solution that has a substantially lead-free tin is applied over the substrate 12 to form a bump precursor 36. Thereafter the thick mask 30 is stripped to leave the sidewalls 38 exposed. A spin-rinse-dry (SRD) clean follows the mask stripping and is carried out according to known technique.

A first etching is carried out to remove the copper second layer 28 in order to form the copper second layer 29. A first etching is carried out with a solution including from about 0.5 to about 2 parts $H_2O_2$, about 10 parts ammonium hydroxide, and about 50 parts water. The, first etching includes substantially removing the copper-containing seed layer 28 at ambient temperature, and for a time period to penetrate and remove the copper-containing seed layer 28, and to form the copper second layer 29. In one embodiment, the copper-containing seed layer 28 is from about 500 Å to about 4,000 Å. In one embodiment, etch processing is carried out in a basic (about pH 7 and higher) solution. In one embodiment, a 2,000 Å-thick copper-containing seed layer 28 is etched under the above conditions during a time period from about 2 to about 5 minutes. After the first etching, the structure is rinsed in deionized (DI) water for about 7 minutes according to known technique.

A second etching is carried out to remove unneeded portions of the titanium metal barrier first layer 26. The etch recipe includes a second etching with a solution including from about 0.5 to about 2 parts HF, about 180 parts water. The second etching includes removing parts of the titanium-containing barrier metal first layer 26 at ambient temperature, and for a time period to penetrate and remove the titanium-containing barrier metal first layer 26, where the titanium-containing barrier metal first layer 26 is from about 500 Å to about 2,000 Å. In one embodiment, the etching conditions include a time period from about 2 to about 5 minutes or until the titanium-containing barrier metal first layer 27 is formed.

In one embodiment, a 1,000 Å thick titanium-containing barrier metal first layer 26 is etched by use of 2 liter DI water and 10 milliliter of 49% HF for about 3 minutes.

After the second etch, the structure is dipped in DI water. Thereafter, another SRD clean is done. Following the SRD clean, a methylsulphonic acid (MSA) clean is carried out in which about 10 parts water and about 1 part MSA contact the structure for about 10 minutes. Thereafter, a third SRD clean is done.

Thereafter, the bump precursor 36 is reflowed to form a solder ball 37, although the reflow may be delayed until a flip-chip configuration has been formed. Accordingly, flip-chip processing is carried out in which a mounting substrate 138 (FIG. 12) is imposed over the semiconductor structure 110.

Figure 13:
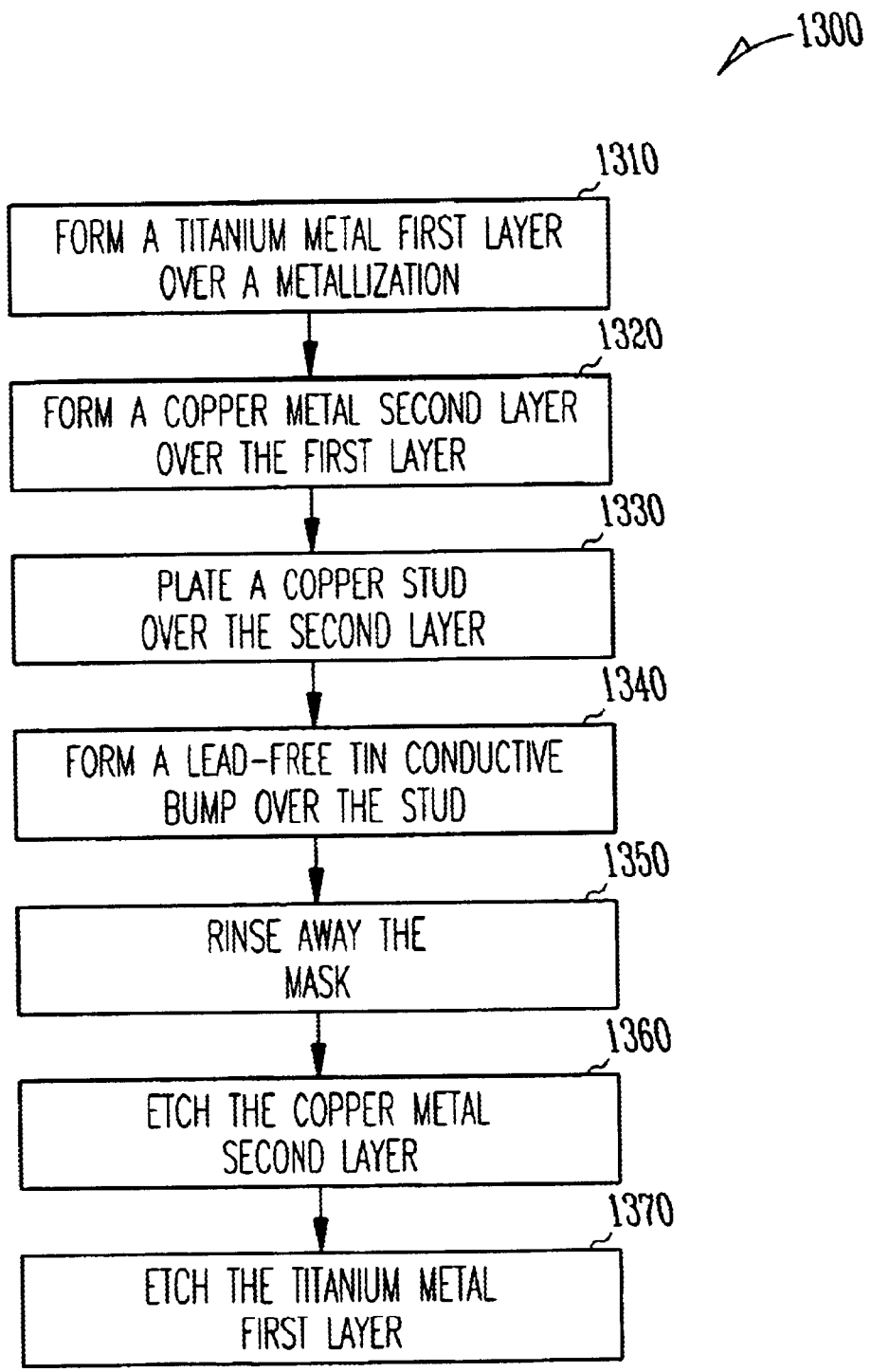
FIG. 13 is a chart that describes a process flow embodiment.

FIG. 13 is a process flow diagram 1300 according to an embodiment. At 1310, the process includes forming a metal first layer over a metallization as set forth herein. At 1320, processing continues by forming a metal second layer over the metal first layer. At 1330, copper stud is plated over the metal second layer. At 1340, an electrically conductive bump is plated over the copper stud. At 1350, the mask is rinsed to expose sidewalls of the copper stud. At 1360, the metal second layer is first etched as set forth herein. Finally, at 1370, the metal first layer is second etched. Additionally, a flip chip may be bonded to the electrically conductive bump.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
    first etching a structure including:
        a titanium-containing barrier first layer above and on a metallization;
        a copper-containing seed second layer above and on the barrier first layer;
        a copper-containing stud above and on the seed second layer; and
        a tin-containing bump above and on the stud;
    wherein first etching etches the copper-containing seed second layer, and wherein first etching includes an etch recipe that is selective to the tin-containing bump, and wherein the etch recipe resists formation of oxide compounds on the copper-containing seed second layer.

2. The process according to claim 1, wherein first etching includes an etch recipe from about 0.5 to about 2 parts etchant, from about 5 to about 20 parts pH adjustor, and the balance water.

3. The process according to claim 1, wherein first etching includes an etch recipe from about 0.5 to about 2 parts $H_2O_2$, about 10 parts pH adjustor, and about 50 parts water.

4. The process according to claim 1, wherein first etching includes an etch recipe from about 0.5 to about 2 parts $H_2O_2$, about 10 parts ammonium hydroxide, and about 50 parts water.

5. The process according to claim 1, wherein first etching includes an etch recipe from about 0.5 to about 2 parts $H_2O_2$, about 10 parts ammonium hydroxide, and about 50 parts water, and wherein first etching includes substantially removing a portion of the copper-containing seed second layer at ambient temperature, and for a time period to penetrate the copper-containing seed second layer to a depth from about 500 Å to about 4,000 Å.

6. The process according to claim 1, further including:
    second etching the structure, wherein second etching removes a portion of the titanium-containing barrier first layer, and wherein second etching is selective to the copper-containing seed second layer, the copper-containing stud, and the tin-containing bump.

7. The process according to claim 1, further including:
    second etching the structure, wherein second etching removes a portion of the titanium-containing barrier first layer, and wherein second etching includes an etch recipe from about 0.5 to about 2 parts HF and from about 100 parts water to about 500 parts water.

8. The process according to claim 1, further including:
    second etching the structure, wherein second etching removes a portion of the titanium-containing barrier first layer, and wherein second etching includes an etch recipe from about 0.5 to about 2 parts HF and about 180 parts water, and wherein second etching includes substantially removing a portion of the titanium-containing barrier first layer at ambient temperature, and for a time period to penetrate the titanium-containing barrier first layer to a depth from about 500 Å to about 2,000 Å.

9. A process comprising:
    first etching a structure, the structure including:
        a titanium barrier first layer above and on a metallization;
        a copper seed second layer above and on the barrier first layer;
        a copper stud above and on the seed second layer; and
        a substantially lead-free tin bump above and on the stud, wherein first etching etches the copper seed second layer with an etch recipe that includes about 0.5 to about 2 parts etchant, about 10 parts pH adjustor, and about 50 parts water, wherein first etching includes a first etch recipe that is selective to the substantially lead-free tin bump, and
    wherein the first etch recipe resists formation of oxide compounds on the copper-containing seed second layer; and
    second etching the titanium barrier first layer, wherein second etching etches the titanium barrier first layer with an etch recipe that includes about 0.5 to about 2 parts etchant, and about 180 parts water, wherein second etching includes a second etch recipe that is selective to the copper stud and the substantially lead-free tin bump.

10. The process according to claim 9, wherein first etching includes an etch recipe from about 0.5 to about 2 parts $H_2O_2$, about 10 parts ammonium hydroxide, and about 50 parts water.

11. The process according to claim 9, wherein first etching includes first etching the structure with an etch recipe from about 0.5 to about 2 parts $H_2O_2$, about 10 parts ammonium hydroxide, and about 50 parts water, and wherein first etching includes substantially removes a portion of the copper seed second layer at ambient temperature, and for a time period to penetrate where the copper seed second layer from about 1,000 Å to about 4,000 Å.

12. The process according to claim 9, wherein second etching includes an etch recipe from about 0.5 to about 2 parts HF and about 180 parts water.

13. The process according to claim 9, wherein second etching includes second etching the structure with an etch recipe from about 0.5 to about 2 parts HF and about 180 parts water, and wherein second etching substantially removes the titanium barrier first layer at ambient temperature, and for a time period to penetrate where the titanium barrier first layer to a depth from about 500 Å to about 2,000 Å.

14. A process comprising:
   first etching a structure including:
      a titanium-containing barrier first layer above and on a metallization;
      a copper-containing seed second layer above and on the barrier first layer;
      a copper-containing stud above and on the seed second layer; and
      a tin-containing bump above and on the stud;
   wherein first etching etches the copper-containing seed second layer to penetrate the copper-containing seed second layer to a depth from about 500 Å to about 4,000 Å, and wherein first etching includes an etch recipe that is selective to the tin-containing bump, and wherein the etch recipe resists formation of oxide compounds on the copper-containing seed second layer.

15. The process of claim 14, wherein first etching is at ambient temperature.

16. The process of claim 14, wherein first etching includes an etch recipe from about 0.5 to about 2 parts etchant, from about 5 to about 20 parts pH adjustor, and the balance water.

17. The process of claim 14, wherein first etching includes an etch recipe from about 0.5 to about 2 parts $H_2O_2$, about 10 parts pH adjustor, and about 50 parts water.

18. The process of claim 14, wherein first etching includes an etch recipe from about 0.5 to about 2 parts $H_2O_2$, about 10 parts ammonium hydroxide, and about 50 parts water.

19. The process of claim 14, further including:
   second etching the structure, wherein second etching removes a portion of the titanium-containing barrier first layer, and wherein second etching includes an etch recipe from about 0.5 to about 2 parts HF and from about 100 parts water to about 500 parts water.

20. The process of claim 14, further including:
   second etching the structure, wherein second etching removes a portion of the titanium-containing barrier first layer, and wherein second etching includes an etch recipe from about 0.5 to about 2 parts HF and about 180 parts water, and wherein second etching includes substantially removing a portion of the titanium-containing barrier first layer at ambient temperature, and for a time period to penetrate the titanium-containing barrier first layer to a depth from about 500 Å to about 2,000 Å.

21. A process comprising:
   first etching a structure, the structure including:
      a titanium barrier first layer above and on a metallization;
      a copper seed second layer above and on the barrier first layer;
      a copper stud above and on the seed second layer; and
      a substantially lead-free tin bump above and on the stud, wherein first etching etches the copper seed second layer with an etch recipe that includes about 0.5 to about 2 parts etchant, about 10 parts pH adjustor, and about 50 parts water, wherein first etching includes a first etch recipe including from about 0.5 to about 2 parts $H_2O_2$, about 10 parts ammonium hydroxide, and about 50 parts water, and wherein the first etch recipe resists formation of oxide compounds on the copper-containing seed second layer; and
   second etching the titanium barrier first layer, wherein second etching etches the titanium barrier first layer with an etch recipe that includes about 0.5 to about 2 parts HF, and about 180 parts water, wherein second etching includes a second etch recipe that is selective to the copper stud and the substantially lead-free tin bump.

22. The process of claim 21, wherein first etching includes substantially removes a portion of the copper seed second layer at ambient temperature, and for a time period to penetrate where the copper seed second layer from about 1,000 Å to about 4,000 Å.

23. The process of claim 21, wherein second etching substantially removes the titanium barrier first layer at ambient temperature, and for a time period to penetrate the titanium barrier first layer to a depth from about 500 Å to about 2,000 Å.

* * * * *